US007508673B2

(12) United States Patent
Kim et al.

(10) Patent No.: US 7,508,673 B2
(45) Date of Patent: Mar. 24, 2009

(54) HEAT DISSIPATING APPARATUS FOR PLASMA DISPLAY DEVICE

(75) Inventors: Hyouk Kim, Suwon-si (KR); Sung-Won Bae, Suwon-si (KR); Joong-Ha Ahn, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 340 days.

(21) Appl. No.: 11/072,680

(22) Filed: Mar. 3, 2005

(65) Prior Publication Data

US 2005/0194900 A1 Sep. 8, 2005

(30) Foreign Application Priority Data

Mar. 4, 2004 (KR) ...................... 10-2004-0014564
Apr. 29, 2004 (KR) ...................... 10-2004-0029918

(51) Int. Cl.
*H05K 7/20* (2006.01)
*H01J 7/24* (2006.01)
*G09G 3/28* (2006.01)
*H04N 5/74* (2006.01)

(52) U.S. Cl. ....................... 361/704; 361/707; 361/710; 361/719; 313/46; 345/60; 348/748

(58) Field of Classification Search ................. 361/704, 361/707, 709–710, 714–715, 718–719; 313/46; 345/60; 348/748; 349/161
See application file for complete search history.

(56) References Cited

U.S. PATENT DOCUMENTS 5,541,618 A 7/1996 Shinoda
5,661,500 A 8/1997 Shinoda et al.
5,663,741 A 9/1997 Kanazawa
5,674,553 A 10/1997 Shinoda et al.
5,724,054 A 3/1998 Shinoda (Continued)

FOREIGN PATENT DOCUMENTS

CN 1174395 2/1998

(Continued)

OTHER PUBLICATIONS

Patent Abstracts of Japan, Publication No. 05-313184, dated Nov. 26, 1993, in the name of Masanori Takahashi et al.

(Continued)

*Primary Examiner*—Jayprakash N Gandhi
*Assistant Examiner*—Zachary M Pape
(74) *Attorney, Agent, or Firm*—Christie, Parker & Hale, LLP

(57) ABSTRACT

A heat dissipation apparatus for use with a plasma display device and a method of conducting the heat generated in the plasma display panel and the driving ICs of the plasma display device to various surfaces of the device for dissipation to air. A first heat sink is disposed between the plasma display panel and the chassis base. The first heat sink is positioned at a first region where the heat generated from the driver ICs is substantially concentrated. A second heat sink is positioned at a second region between the plasma display panel and the chassis base where the heat generated by the plasma display panel is substantially concentrated. A number of additional thermal conduction media are also used in the various embodiments of the invention.

21 Claims, 10 Drawing Sheets

U.S. PATENT DOCUMENTS

| | | | |
|---|---|---|---|
| 5,786,794 | A | 7/1998 | Kishi et al. |
| 5,952,782 | A | 9/1999 | Nanto et al. |
| 5,971,566 | A | 10/1999 | Tani et al. |
| 6,275,220 | B1 | 8/2001 | Nitta |
| 6,288,489 | B1 | 9/2001 | Isohata et al. |
| RE37,444 | E | 11/2001 | Kanazawa |
| 6,366,264 | B1 | 4/2002 | Kurumada |
| 6,522,543 | B2 | 2/2003 | Kurihara et al. |
| 6,534,722 | B2 * | 3/2003 | Takaoka ..................... 174/254 |
| 6,597,113 | B1 | 7/2003 | Nitta |
| 6,630,916 | B1 | 10/2003 | Shinoda |
| 6,633,126 | B1 | 10/2003 | Tsai et al. |
| 6,677,664 | B2 | 1/2004 | Inoue et al. |
| 6,700,315 | B2 * | 3/2004 | Kim et al. ..................... 313/46 |
| 6,703,702 | B2 | 3/2004 | Inoue et al. |
| 6,707,436 | B2 | 3/2004 | Setoguchi et al. |
| 6,761,813 | B2 | 7/2004 | Xu |
| 6,774,872 | B1 | 8/2004 | Kawada et al. |
| 6,794,026 | B2 | 9/2004 | Ebihara et al. |
| 6,833,674 | B2 * | 12/2004 | Kaneko et al. .............. 313/587 |
| 6,992,895 | B2 | 1/2006 | Lindberg |
| 7,064,952 | B1 * | 6/2006 | Chen et al. .................. 361/681 |
| 7,218,521 | B2 * | 5/2007 | Kim ........................... 361/704 |
| 7,251,140 | B2 * | 7/2007 | Bae et al. .................... 361/719 |
| 2002/0009944 | A1 | 1/2002 | Ouchi |
| 2002/0014840 | A1 * | 2/2002 | Kaneko et al. .............. 313/587 |
| 2003/0020152 | A1 | 1/2003 | Inoue et al. |
| 2003/0025428 | A1 * | 2/2003 | Kim et al. ..................... 313/46 |
| 2003/0050419 | A1 | 3/2003 | Sanders et al. |
| 2003/0058230 | A1 | 3/2003 | Ide |
| 2003/0102789 | A1 | 6/2003 | Kim et al. |
| 2004/0095727 | A1 | 5/2004 | Houle |
| 2005/0083646 | A1 | 4/2005 | Bae et al. |
| 2005/0088093 | A1 * | 4/2005 | Kim et al. ................... 313/582 |
| 2005/0270436 | A1 * | 12/2005 | Miyamura et al. ............ 349/58 |

FOREIGN PATENT DOCUMENTS

| | | | |
|---|---|---|---|
| CN | 1397999 | A | 2/2003 |
| CN | 1402319 | A | 3/2003 |
| CN | 1420557 | A | 5/2003 |
| EP | 1 282 169 | A2 | 2/2003 |
| JP | 2-148645 | | 6/1990 |
| JP | 6-342165 | | 5/1993 |
| JP | 5-313184 | | 11/1993 |
| JP | 10-40823 | | 2/1998 |
| JP | 10-260641 | | 9/1998 |
| JP | 2845183 | | 10/1998 |
| JP | 10333173 | A | 12/1998 |
| JP | 2917279 | | 4/1999 |
| JP | 2000-42642 | | 2/2000 |
| JP | 2000-56701 | | 2/2000 |
| JP | 2000-242189 | | 9/2000 |
| JP | 2001-035397 | | 2/2001 |
| JP | 2001-43804 | | 2/2001 |
| JP | 2001-170721 | | 6/2001 |
| JP | 2001-266760 | | 9/2001 |
| JP | 2001-308233 | | 11/2001 |
| JP | 2001-325888 | | 11/2001 |
| JP | 2001-326879 | | 11/2001 |
| JP | 2001-352022 | | 12/2001 |
| JP | 2002-111261 | | 4/2002 |
| JP | 2003-31980 | | 1/2003 |
| JP | 2003-115568 | | 4/2003 |
| KR | 1998-080313 | | 11/1998 |
| KR | 2001-0098816 | | 11/2001 |
| KR | 2003-0011647 | | 2/2003 |
| KR | 10 2005-0037068 | | 4/2005 |

OTHER PUBLICATIONS

Patent Abstracts of Japan, Publication No. 06-342165, dated Dec. 13, 1994, in the name of Kenji Mizuno et al.
Patent Abstracts of Japan, Publication No. 10-260641, dated Sep. 29, 1998, in the name of Hideto Nitta.
Patent Abstracts of Japan, Publication No. 2000-042642, dated Feb. 15, 2000, in the name of Hideyuki Miyahara.
Patent Abstracts of Japan, Publication No. 2000-242189, dated Sep. 8, 2000, in the name of Shutaro Tsuchiya et al.
Patent Abstracts of Japan, Publication No. 2001-170721, dated Jun. 26, 2001, in the name of Hiroyuki Komatsu et al.
Patent Abstracts of Japan, Publication No. 2001-326879, dated Nov. 22, 200, in the name of Masanori Takahashi et al.
Patent Abstracts of Japan, Publication No. 2001-32022, dated Dec. 21, 2001, in the name of Koichi Inoue et al.
Patent Abstracts of Japan, Publication No. 2002-111261, dated Apr. 12, 2002, in the name of Mikio Kurihara et al.
Patent Abstracts of Japan, Publication No. 2001-308233, dated Nov. 2, 2001, in the name of Toshiharu Obe.
Patent Abstracts of Japan, Publication No. 2003-115568, dated Apr. 18, 2003, in the name of Toyoshi Kawada et al.
Patent Abstracts of Japan, Publication No. 02-148645; Date of Publication: Jun. 7, 1990; in the name of Toshiyuki Nanto et al.
Patent Abstracts of Japan for Japanese Patent Application No. 2845183; Publication No. 08-102261; Date of Publication: Apr. 16, 1996; in the name of Toshiyuki Nanto et al.
Patent Abstracts of Japan, Publication No. 10-040823; Date of Publication: Feb. 13, 1998; in the name of Yutaka Tani et al.
Patent Abstracts of Japan, Publication No. 10-260641; Date of Publication: Sep. 29, 1998; in the name of Hideto Nitta.
Patent Abstracts of Japan, Publication No. 2000-056701; Date of Publication: Feb. 25, 2000; in the name of Masakazu Kurumada.
Patent Abstracts of Japan, Publication No. 2001-043804; Date of Publication: Feb. 16, 2001; in the name of Takashi Komatsu et al.
Patent Abstracts of Japan, Publication No. 2001-325888; Date of Publication: Nov. 22, 2001; in the name of Yoshitaka Terao et al.
Korean Patent Abstracts, Publication No. 1020010098816 A; Date of Publication: Nov. 8, 2001; in the name of Osamu Hirohashi et al.
Korean Patent Abstracts, Publication No. 1020030011647 A; Date of Publication No. Feb. 11, 2003; in the name of Hirokazu Inoue et al.
U.S. Office action dated Jul. 26, 2007 for related U.S. Appl. No. 10/963,611.
U.S. Office action dated Feb. 21, 2007 for related U.S. Appl. No. 10/963,611.
Patent Abstracts of Japan for Publication No. 2001-035397, published Feb. 9, 2001 in the name of Masaaki Murakami et al.
Patent Abstracts of Japan for Publication No. 2001-266760, published Sep. 28, 2001 in the name of Shigeo Ohashi et al.

* cited by examiner

HEAT DISSIPATING APPARATUS FOR PLASMA DISPLAY DEVICE

CROSS REFERENCES TO RELATED APPLICATION

This application claims priority to and the benefit of Korean Patent Application No. 10-2004-0014564 filed on Mar. 4, 2004 and Korean Patent Application No. 10-2004-0029918 filed on Apr. 29, 2004 in the Korean Intellectual Property Office, the entire contents of both of which are incorporated herein by reference.

BACKGROUND OF THE INVENTION

1. Field of the Invention

The present invention relates to a plasma display device, and, more particularly, to a plasma display device that includes a cover plate to efficiently dissipate the heat produced by a driver IC.

2. Description of Related Art

Generally, a plasma display apparatus is a device where images are displayed on a plasma display panel (simply referred to hereinafter as the "PDP") using the plasma generated through the gas discharging.

With the plasma display apparatus, heat is generated during the process of discharging the gas in the PDP to generate plasma. When the degree of gas discharging is heightened to enhance the luminance, more heat is generated from the PDP.

The heat induced by the gas discharging is conducted to the chassis base, and affects the driving circuit mounted at the backside of the chassis base so that the driving circuit may make unstable signal processing while inducing the mis-operation of the integrated circuit for processing the electrical signals with the driving of the PDP. Moreover, in case the mis-operation degree of the driving circuit or the integrated circuit is extremely high, black stripes may be made on the screen, deteriorating the display screen quality.

Accordingly, it is necessary to dissipate the heat generated from the PDP to the outside. With the common heat dissipation technique, the PDP is attached to the chassis base formed with a material having an excellent thermal conductivity. A heat sink, such as a heat dissipation sheet, is disposed between the PDP and the chassis base. As a result, the heat generated from the PDP is dissipated to the outside of the display device via the heat sink and the chassis base.

The plasma display panel has electrodes that are electrically connected to a driving circuit, and a driver IC supplies voltage signals to the electrodes in accordance with signals output by the driving circuit.

Voltage application structures using a driver IC include a Chip-On-Board (COB) structure where the driver IC is mounted on a Printed Circuit Board (PCB), and a Chip-On-Film (COF) structure where the driver IC is directly mounted on a Flexible Printed Circuit (FPC) film. A small-sized and low cost Tape Carrier Package (TCP) is now being extensively used as a voltage application structure.

In order to express at least a 256 gray scale with a plasma display panel, at least eight-timed address discharges must occur during 1/60 of a second corresponding to one TV field, and hence, a considerable amount of heat is generated by the COF, the COB, or the TCP mounted on the chassis base.

Accordingly, a reinforcing plate is provided with the COB or the COF to reinforce its structural intensity integrity and fix it to the chassis base. The reinforcing plate further has a role of a heat sink to dissipate the heat generated by the IC to the outside.

A heat sink is used in order to dissipate the heat produced by the TCP driver IC. The heat sink that is used can be a solid heat dissipating sheet attached to the TCP to dissipate the heat into the air. However, such a heat sink has the low heat dissipation efficiency. Therefore, there is a problem in that the heat sink must be large relative to the size of the driver IC to dissipate the large amount of heat generated by the TCP driver IC.

SUMMARY OF THE INVENTION

It is an object of the present invention to provide a plasma display apparatus which has a heat dissipating structure for a driver IC that is capable of enhancing the reliability of the driver IC in that it efficiently dissipates the heat produced by the driver IC to prevent a breakdown or other malfunction from occurring.

It is another object of the present invention to provide a plasma display apparatus which enhances the structure of a heat sink disposed between the PDP and the chassis base, and has an enhanced driver IC heat dissipating structure capable of dissipating and diffusing the heat generated from the driver ICs via the chassis base while maintaining the heat dissipation structure of the conventional PDP.

This and other objects may be achieved by a plasma display apparatus with the following features.

A plasma display apparatus according to an aspect of the present invention comprises: a plasma display panel; a chassis base having the plasma display panel on one side surface thereof and having a driving circuit arranged on another side surface thereof; a driver IC electrically connecting electrodes of the plasma display panel to the driving circuit, the driver IC adapted to supply voltage signals to the electrodes of the plasma display panel in accordance with signals from the driving circuit; a cover plate arranged adjacent to the driver IC and facing the chassis base to interpose the driver IC between the chassis base and the cover plate; and a first thermal conduction medium arranged between the cover plate and the driver IC and adapted to transfer heat generated by the driver IC to the cover plate.

The first thermal conduction medium is preferably silicone oil or a thermal grease. The first thermal conduction medium preferably has a coefficient of thermal conductivity of not less than 1.0 W/mK and a viscosity of not less than 100,000 cP.

A high thermally conductive solid member is preferably arranged on a portion of the chassis base opposite the driver IC. The plasma display apparatus further preferably comprises a second thermal conduction medium disposed between the solid member and the driver IC and adapted to transfer heat generated by the driver IC to the high thermally conductive solid member. The plasma display apparatus further preferably comprises a third thermal conduction medium arranged between the first thermal conduction medium and the driver IC. The third thermal conduction medium is preferably a thermally conductive sheet.

A plasma display apparatus according to another aspect of the present invention includes a plasma display panel, and a chassis base proceeding substantially parallel to the plasma display panel with a surface facing the plasma display panel and an opposite surface mounting a driving circuit unit thereon. Driver ICs selectively apply voltage to electrodes of the plasma display panel in accordance with the control signals from the driving circuit unit. A cover plate is placed external to the driver IC, and fitted to the chassis base to compress the driver IC against the chassis base. A first heat sink is disposed between the plasma display panel and the chassis base. The first heat sink is positioned at a first region where the heat generated from the driver ICs is substantially concentrated. A second heat sink is positioned at a second region between the plasma display panel and the chassis base except for the first region.

The first region is the heat dissipation region of the driver ICs, and the second region is the heat dissipation region of the plasma display panel.

The driver ICs are arranged at the periphery of the chassis base corresponding to the one-sided periphery of the plasma display panel.

The first heat sink has a high thermal conduction medium attached to the chassis base at the first region between the plasma display panel and the chassis base, and a low thermal conduction medium attached to the plasma display panel at the first region between the plasma display panel and the chassis base. The second heat sink has a high thermal conduction medium attached to the plasma display panel at the second region between the plasma display panel and the chassis base, and a low thermal conduction medium attached to the chassis base at the second region between the plasma display panel and the chassis base. In this case, the high thermal conduction medium is formed with a sheet based on a material having a thermal conductivity of 0.5 W/mK or more, selected from metal, silicone, acryl, graphite, rubber, or carbon nanotube. The low thermal conduction medium is formed with a sheet based on a material having a thermal conductivity of 0.5 W/mK or less, selected from plastic resin, silicone, acryl, or rubber.

The driver ICs are packaged in the form of a tape carrier package (TCP), and connected to the driving circuit unit and the electrodes drawn out from the plasma display panel.

A thermal conduction medium may be disposed between the cover plate and the driver IC to conduct the heat generated from the driver IC to the cover plate.

A high thermally conductive solid member may be disposed between the driver ICs and the chassis base. In this case, the high thermally conductive solid member is coupled to the chassis base using a coupling member. The high thermally conductive solid member is integrated with the chassis base in a body.

A thermal conduction medium may be disposed between the high thermally conductive solid member and the driver IC to conduct the heat generated from the driver IC to the high thermally conductive solid member. In this case, the thermal conduction medium is preferably formed with liquid or gel typed silicone oil or thermal grease.

DETAILED DESCRIPTION

The present invention will be described more fully hereinafter with reference to the accompanying drawings, in which preferred embodiments of the invention are shown.

Figure 1:
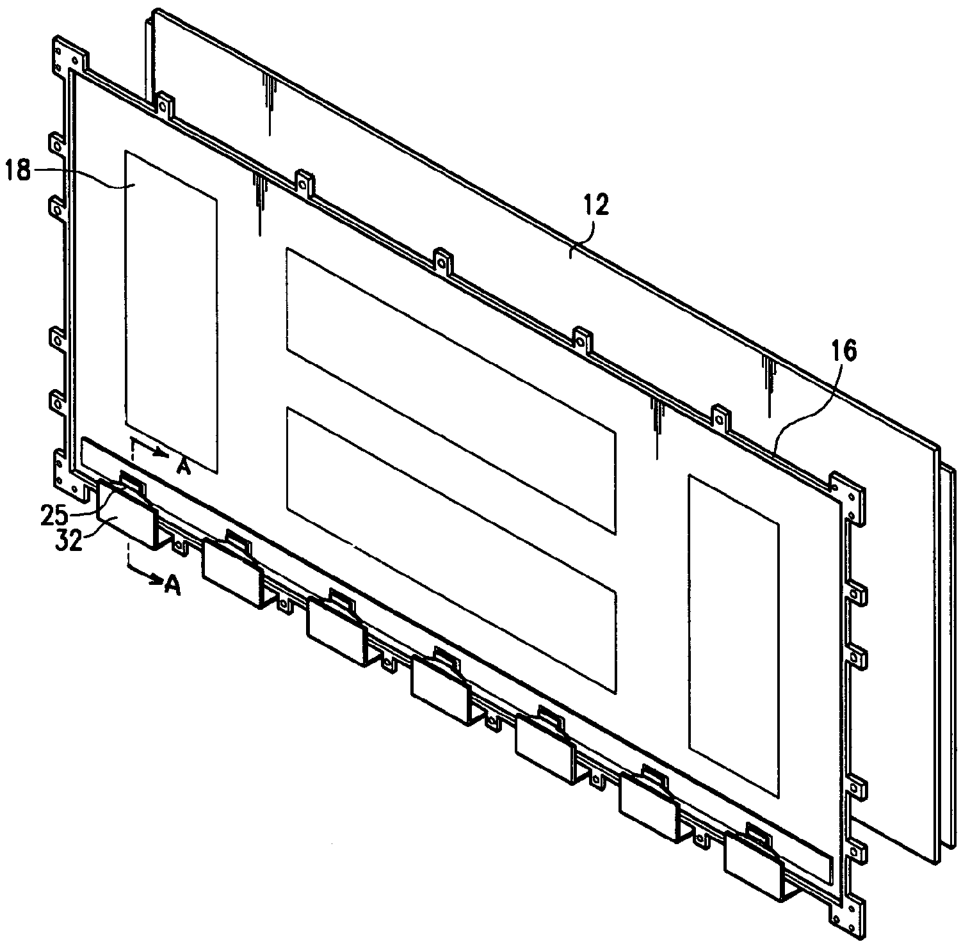
FIG. 1 is an exploded perspective view of a plasma display apparatus having a heat dissipating structure for a driver IC according to a first embodiment of the present invention.
Figure 2:
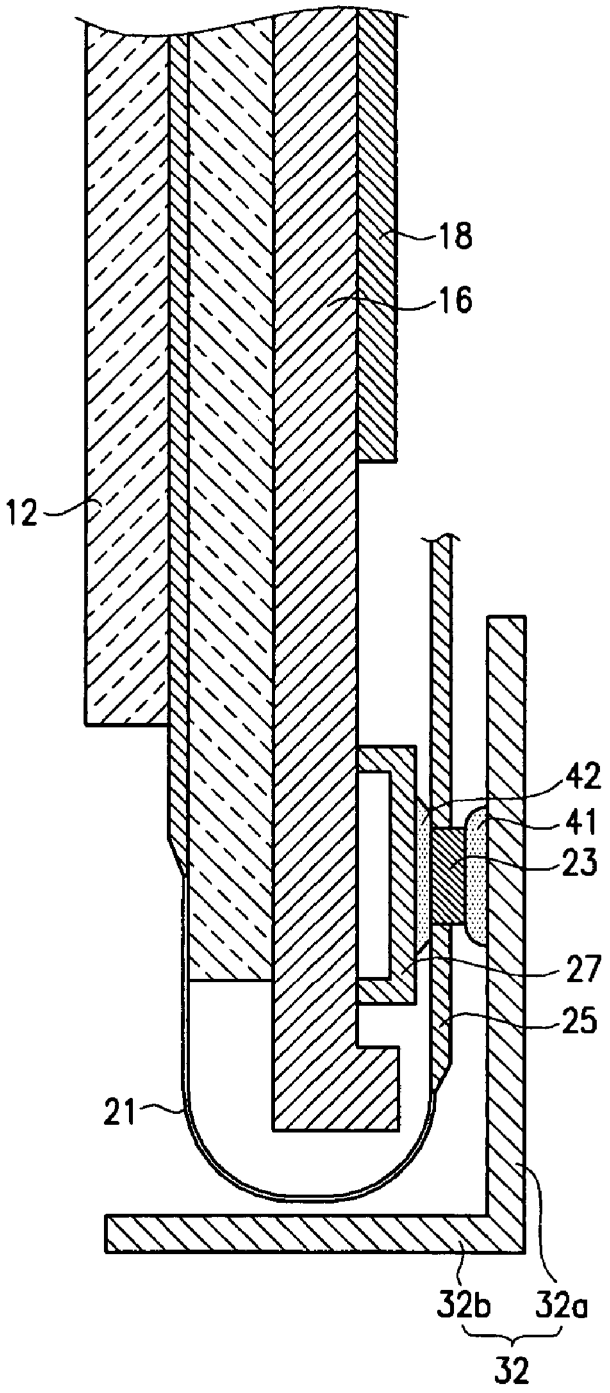
FIG. 2 is a cross-sectional view taken along the A-A line of FIG. 1.

FIG. 1 is an exploded perspective view of a plasma display apparatus having a heat dissipating structure for a driver IC according to a first embodiment of the present invention, and FIG. 2 is a cross-sectional view taken along the A-A line of FIG. 1.

With reference to FIG. 1 and FIG. 2, the plasma display apparatus includes a plasma display panel 12 (referred to hereinafter simply as a "PDP"), and a chassis base 16. The chassis base 16 is made of Cu, Fe, or the like, and the PDP 12 is mounted on one side surface thereof and a driving circuit 18 is mounted on the other side surface of the chassis base 16.

The PDP 12 of the plasma display device is mounted on a chassis base, with a front cover (not shown) on the outside of the PDP 12 and a rear cover (not shown) on the outside of a chassis base.

Electrodes extending from the periphery of the PDP 12 are electrically connected to the driving circuit 18 to receive the signals required for driving the PDP 12.

A driver IC 23 is disposed between the PDP 12 and the driving circuit 18 to supply voltage signals to the electrodes in accordance with signals from the driving circuit.

The driver IC 23 is packaged in the form of a TCP 25 so that it electrically interconnects the driving circuit 18 and the electrodes drawn out from the PDP 12. The driver IC 23 is arranged opposite to the chassis base 16.

On the outside of the driver IC 23, that is, the outside of the TCP 25, a cover plate 32 is arranged to support the TCP 25 and to fix it to the chassis base 16. The cover plate 32 is positioned in parallel with and along the periphery of the chassis base 16.

The cover plate 32 can be positioned in an integral plate longitudinally along the periphery of the chassis base 16, and a plurality of the cover plates 32 can be positioned successively along the periphery of the chassis base 16, wherein each of the cover plates 32 respectively corresponds to the driver IC 23. The cover plate 32 can be provided with a first portion 32*a* opposite to the driver IC 23 and a second portion 32*b* extending integrally from one distal end of the first portion toward the peripheral edge of the PDP 12. Such a cover plate 32 can be made of Al, Cu, Fe, or the like in the same manner as the chassis base 16. The cover plate 32 can be affixed to a high thermally conductive solid member 27 (or high thermal conductivity solid member) as discussed below by means of a fastening member (not shown), for example, a screw.

A thermal conduction medium includes a first thermal conduction medium 41, which is interposed between the driver IC 23 and the first portion 32*a* of the cover plate 32, and a second thermal conduction medium 42 in a liquid or gel state is further interposed between the driver IC 23 and the high thermally conductive solid member 27.

In more detail, the first thermal conduction medium 41 should be in a liquid or gel state at least at the operation temperature of the PDP 12, and can be a silicone oil or thermal grease. Such a first thermal conduction medium 41 has a coefficient of thermal conductivity of more than 1.0 W/mK so as to not flow into the periphery of the circuit elements when the apparatus stands upright. Also, it is preferable that the first thermal conduction medium 41 has a thickness of 0.2 mm between the first portion 32*a* and the driver IC 23.

A fastening member (not shown) makes the cover plate 32 compress so as to contact the driver IC 23 with a predetermined pressure determined by the fastening force. With the above heat dissipating structure, the heat generated by the driver IC 23 is transferred through the first thermal conduction medium 41 to the cover plate 32 and is continuously dissipated into the air.

In addition, the second thermal conduction medium 42 has the same characteristics as that of the first thermal conduction medium 41. Accordingly, the heat generated at the driver IC 23 is transferred through the second thermal conduction medium 42 to the high thermally conductive solid member 27. Then, the heat transferred to the high thermally conductive solid member 27 is conducted to the chassis base 16 and is continuously dissipated into the air.

In the plasma display apparatus according to the embodiment discussed above, the cover plate 32 is fitted to the high thermally conductive solid member 27 while compressing the driver IC 23 with a predetermined pressure. Then, the driver IC 23 is brought into close contact with the high thermally conductive solid member 27. Since the first thermal conductive medium 41 is interposed between the cover plate 32 and the driver IC 23, the first thermal medium 41 is in close contact with the cover plate 32 and the driver IC 23. That is to say, an air layer is not formed on the boundary surface between the first thermal conduction medium 41 and the cover plate 32 and or between the first thermal conduction medium 41 and the driver IC 23.

In addition, since the second thermal conduction medium 42 disposed between the driver IC 23 and the high thermally conductive solid member 27 is formed of a liquid or gel as is the first thermal conductive medium, the second thermal conductive medium 42 closely contacts the driver IC 23 and the high thermally conductive solid member 27. That is to say, an air layer is not formed on the boundary surface between the second thermal conduction medium 42 and the high thermally conductive solid member 27 or between the second thermal conduction medium 42 and the driver IC 23.

Therefore, the contact area between the cover plate 32 and the driver IC 23 is increased, thereby enhancing the coefficient of thermal conductivity from the driver IC 23 to the cover plate 32. Also, the contact area between the driver IC 23 and the high thermally conductive solid member 27 is increased, thereby enhancing the coefficient of thermal conductivity from the driver IC 23 to the high thermally conductive solid member 27.

Figure 3:
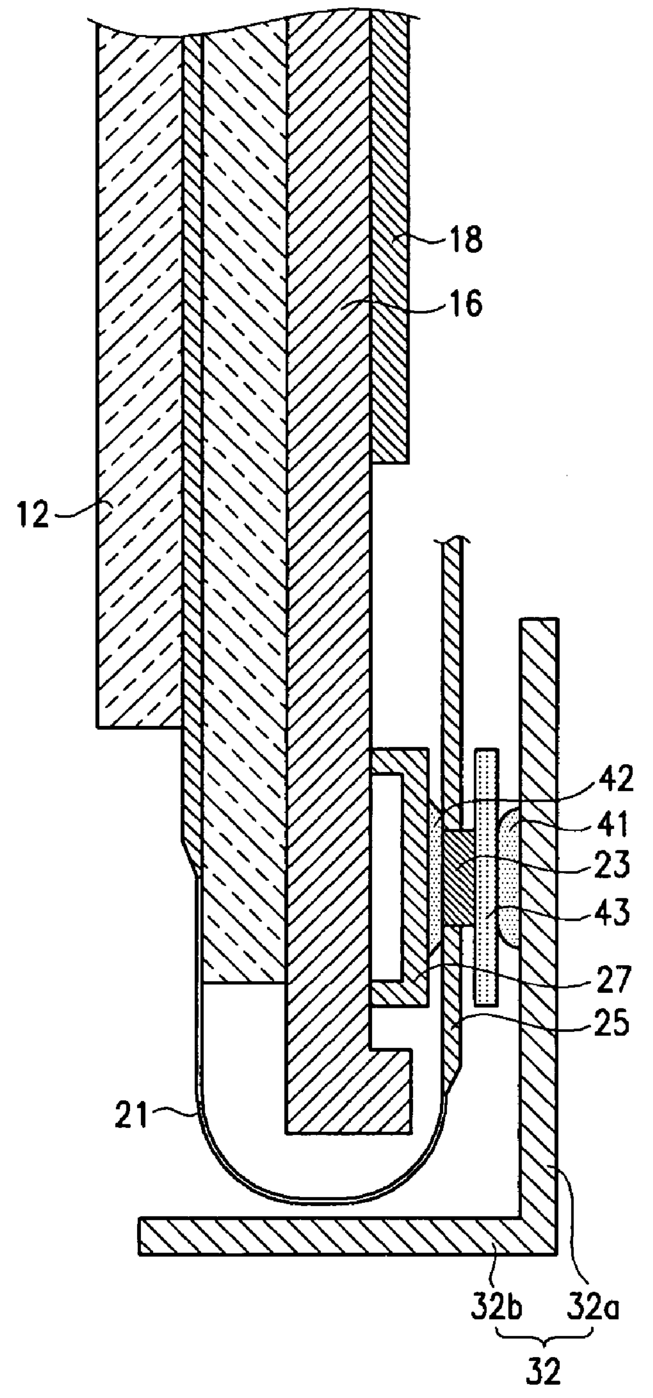
FIG. 3 is a cross-sectional view of a heat dissipating structure for a driver IC according to the second embodiment of the present invention.

FIG. 3 is a cross-sectional view of a heat dissipating structure for a driver IC 23 according to the second embodiment of the present invention.

With reference to FIG. 3, a plasma display apparatus according to the second embodiment of the present invention has a structure in which a third thermal conduction medium 43 in the form of a sheet is interposed between the driver IC 23 and the first thermal conduction medium 41.

In this embodiment, the third thermal conduction medium 43 is disposed between the driver IC 23 and a first portion 32*a* of a cover plate 32, and the first thermal conduction medium 41 is disposed between the first portion 32*a* of the cover plate 32 and the thermal conduction medium 41. The cover plate 32 can also have a second portion 32*b* extending from one distal end of the first portion 32*a* toward the peripheral edge of the PDP 12 and intersecting with the first portion 32*a* so as to support the second portion 32*b*.

The third thermal conduction medium 43 can be formed of a silicone sheet affixed to one side of the driver IC 23 opposite the cover plate 32.

In this embodiment, since the first thermal conduction medium 41 disposed between the third thermal conduction medium 43 and the cover plate 32 is a liquid or gel, the first thermal conductive medium 41 is capable of more closely contacting the third thermal conduction medium 43 and the cover plate 32. That is to say, an air layer is not be formed on the boundary surface between the first thermal conduction medium 41 and the cover plate 32 or between the first and third thermal conduction medium 41 and 43.

Therefore, the contact area where the third thermal conduction medium 43 is in close contact with the first thermal conduction medium 41 is increased, thereby enhancing the coefficient of thermal conductivity from the driver IC 23 to the cover plate 32. Also, the contact area between the driver IC 23 and the high thermally conductive solid member 27 is increased, thereby enhancing the coefficient of thermal conductivity from the driver IC 23 to the high thermally conductive solid member 27.

That is to say, when the cover plate 32 is compressed toward the chassis base 16, the heat generated by the driver IC 23 is firstly transferred to the third thermal conduction medium 43 and then transferred to the first thermal conduction medium 41, thereby allowing the heat to be dissipated into the air by the cover plate 32. As a result, the temperature of the driver IC 23 is effectively reduced.

Figure 4:
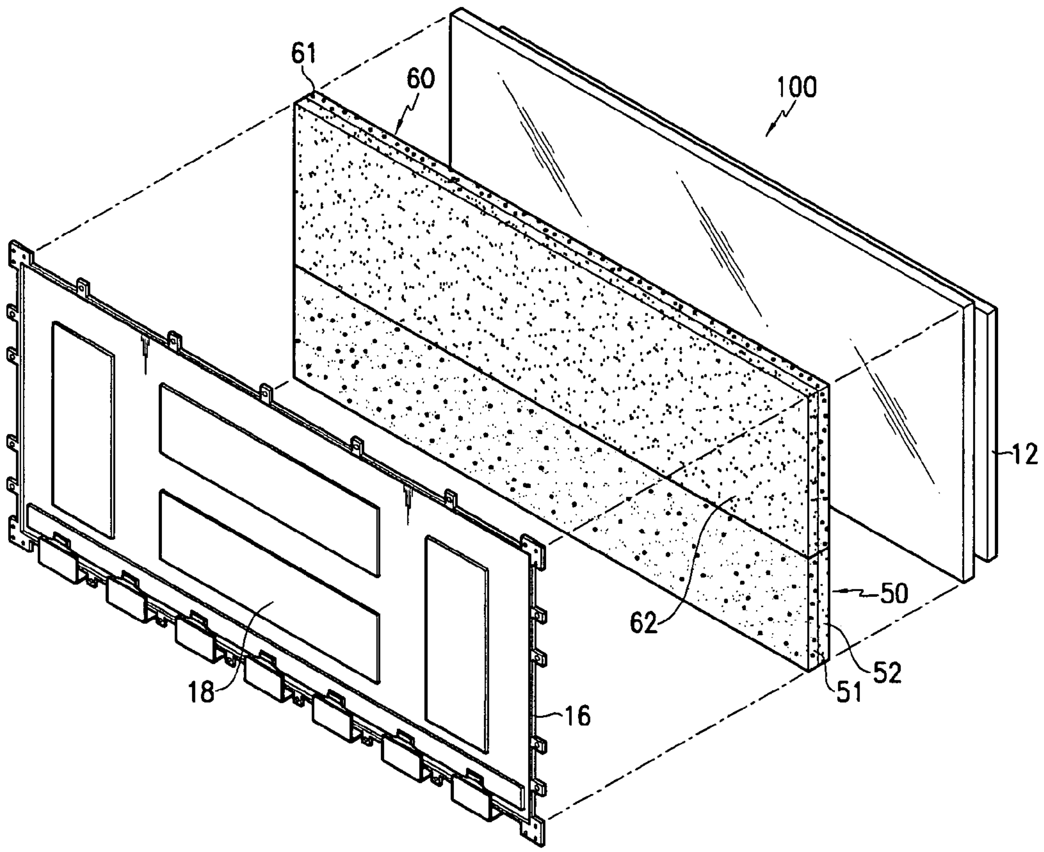
FIG. 4 is an exploded perspective view of a plasma display apparatus according to a third embodiment of the present invention.
Figure 5:
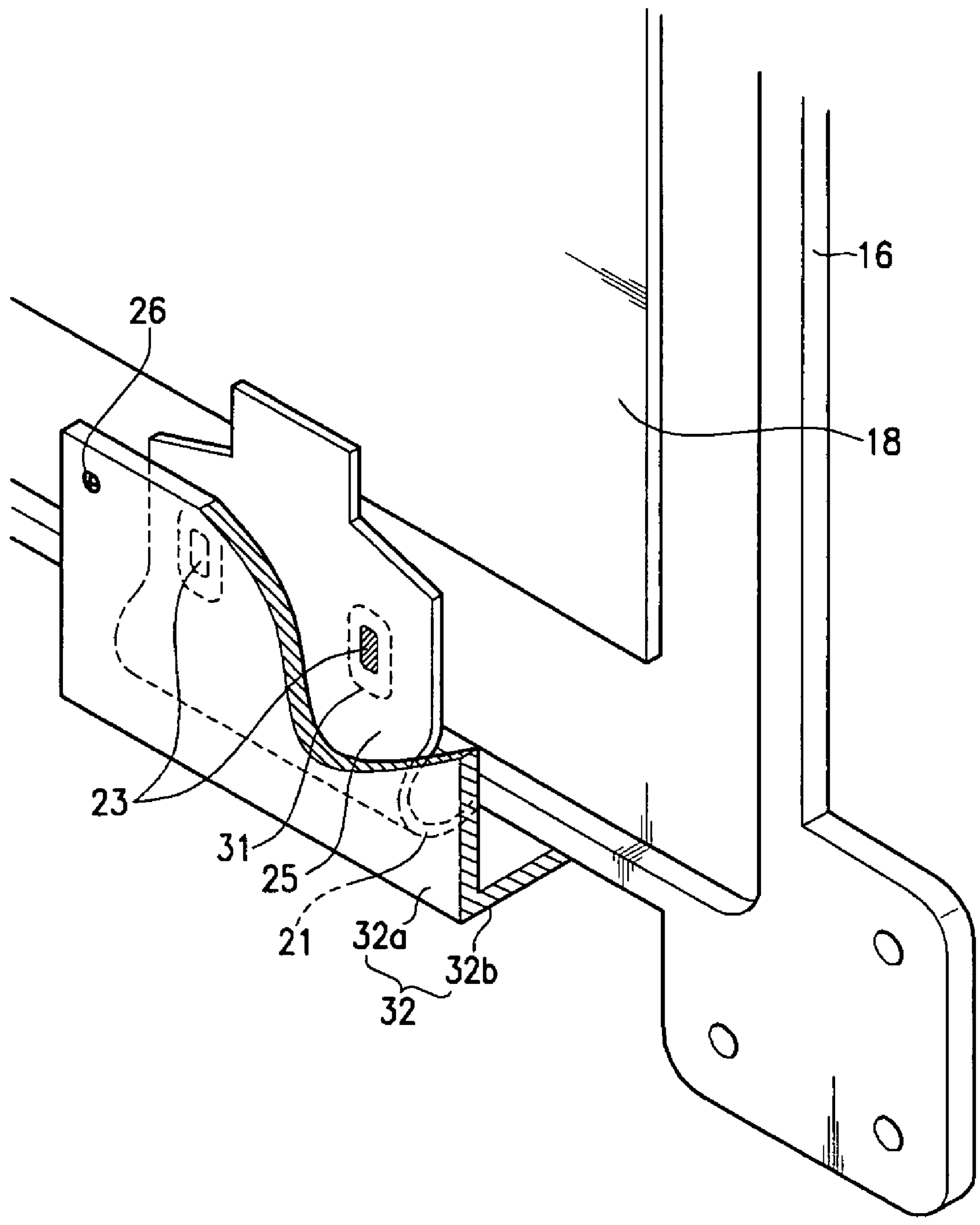
FIG. 5 is a partial sectional perspective view of the chassis base shown in FIG. 4.
Figure 6:
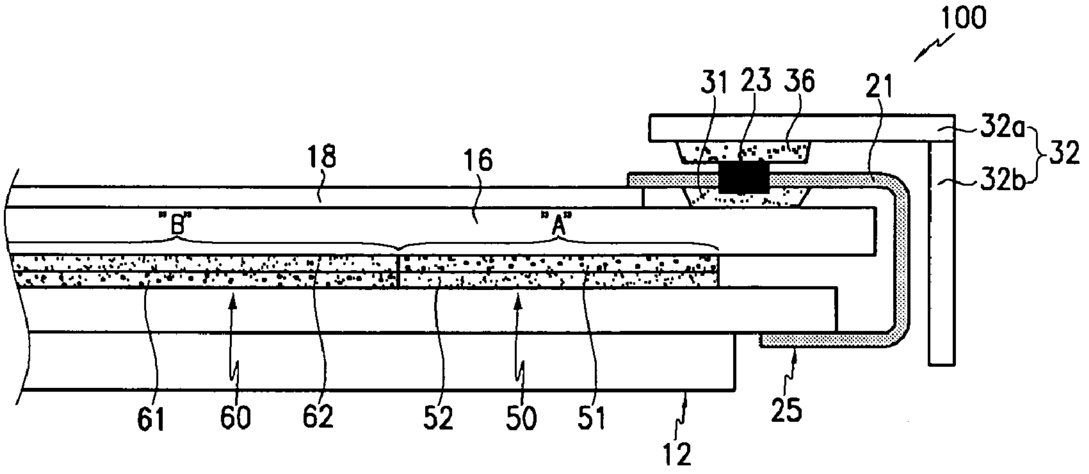
FIG. 6 is a combinatorial sectional view of the plasma display apparatus shown in FIG. 4.

FIG. 4 is an exploded perspective view of a plasma display apparatus according to a third embodiment of the present invention, and FIG. 5 is a partial sectional perspective view of the chassis base shown in FIG. 4. FIG. 6 is a combinatorial sectional view of the plasma display apparatus shown in FIG. 4.

As shown in FIGS. 4 to 6, the plasma display apparatus 100 basically includes a PDP 12, and a chassis base 16. A front cover (not shown) externally surrounds the PDP 12, and a rear cover (not shown) externally surrounds the chassis base 16. The front and the rear covers are combined with each other to thereby complete a plasma display apparatus set.

The chassis base 16 is formed with aluminum, copper, or iron. The PDP 12 is mounted on a one-sided surface of the chassis base 16, and a driving circuit unit 18 is mounted on the opposite-sided surface of the chassis base 16 to drive the PDP 12.

The PDP 12 displays the desired images by exciting phosphors with the vacuum ultraviolet rays generated due to the internal gas discharging thereof, and is roughly rectangular-shaped (in this embodiment, with a pair of long horizontal sides and a pair of short vertical sides).

The PDP 12 has a single scan driving type structure where the electrodes for receiving the signals required for the image display driving, such as address electrodes, are drawn from the one-sided periphery thereof, preferably from the lower long-sided periphery thereof. For this purpose, the electrodes are electrically connected to the driving circuit unit 18 via a flexible printed circuit (FPC) 21, and a plurality of driver integrated circuits (ICs) 23 are disposed between the PDP 12 and the driving circuit unit 18 to selectively apply voltage to the electrodes of the PDP 12 in accordance with the control signals from the driving circuit unit 18. In this embodiment, the driver ICs 23 are packaged in the form of a tape carrier package (TCP) 25, and connected to the driving circuit unit 18 and the electrodes drawn out from the PDP 12. The driver ICs 23 are preferably arranged at the periphery of the chassis base 16 corresponding to the lower long-sided periphery of the PDP 12, from which the electrodes are drawn.

Meanwhile, first and second heat sinks 50 and 60 are disposed between the PDP 12 and the chassis base 16 while being tightly adhered to the PDP 12 and the chassis base 16 to dissipate and diffuse the heat generated from the PDP 12 and the driver ICs 23. Furthermore, a double-sided tape (not shown) is externally provided along the one-sided periphery of the first and the second heat sinks 50 and 60 to attach the PDP 12 and the chassis base 16 to each other while orienting the first and the second heat sinks 50 and 60. Alternatively, instead of the double-sided tape, a silicon or acryl-based adhesive is applied to the surface of the first and the second heat sinks 50 and 60 to directly attach the first and the second heat sinks 50 and 60 to the PDP 12 and the chassis base 16, thereby fixing the PDP and the chassis base 16.

A liquid or gel-typed thermal conduction medium 31 is disposed between the driver IC 23 and the chassis base 16. The thermal conduction medium 31 conducts the heat generated from the driver IC 23 to the chassis base 16. The thermal conduction medium 31 should be in a liquid or gel phase at the temperature where the PDP 12 is operated. The thermal conductivity of the thermal conduction medium 31 is preferably 0.1 W/mK or more. Specifically, silicon oil or thermal grease may be used as the liquid or gel-typed thermal conduction medium 31. Consequently, the heat generated from the driver IC 23 is conducted to the chassis base 16 via the thermal conduction medium 31, and dissipated to the outside.

Moreover, with the plasma display apparatus 100, a cover plate 32 is placed external to the driver IC 23 to support the driver IC 23 while compressing it against the chassis base 16.

The cover plates 32 are arranged along the periphery of the chassis base 16 while proceeding parallel thereto. The cover plate 32 has a first surface 32*a* facing the driver IC 23, and a second surface 32*b* extended from the outer periphery of the first surface 32*a* in a body to the outer periphery of the PDP to support the FPC 21. In order to form such a cover plate 32, a plate may be longitudinally formed along the periphery of the chassis base 16, or as shown in the drawings, a plurality of plates corresponding to the respective driver ICs 23 may be continuously arranged at the periphery of the chassis base 16. As like with the chassis base 16, the cover plate 32 may be formed with aluminum, copper, or iron. The cover plate 32 is coupled to the chassis base 16 using a coupling member 26, such as a screw. Consequently, the cover plate 32 compresses the driver IC 23 by way of the coupling force of the coupling member 26.

A thermal conduction medium 36 is disposed between the cover plate 32 and the driver IC 23. The thermal conduction medium 36 conducts the heat generated from the driver IC 23 to the cover plate 32. The thermal conduction medium 36 may be formed with a silicone sheet, which is attached to the cover plate 32. Consequently, the heat generated from the driver IC 23 is conducted to the cover plate 32 via the heat conduction medium 36, and dissipated to the outside.

When the above-structured plasma display apparatus 100 is operated, much heat is generated from the PDP 12 and the driver ICs 23.

In this connection, the plasma display apparatus 100 has a first heat sink 50 placed between the PDP 12 and the chassis base 16 to effectively dissipate and diffuse the heat generated from the driver ICs 23 via the chassis base 16, and a second heat sink 60 for dissipating and diffusing the heat generated from the PDP 12 via the chassis base 16, as like with the conventional one.

In this embodiment, the first heat sink 50 is disposed between the PDP 12 and the chassis base 16, and positioned at a first region A where the heat generated from the driver ICs 23 is substantially concentrated. The first heat sink 50 has a structure capable of easily dissipating and diffusing the heat conducted from the driver IC 23 to the chassis base 16 via the liquid or gel-typed thermal conduction medium 31.

The first region A refers to the heat dissipation region of the driver ICs 23 corresponding to the location of the driver ICs 23 between the PDP 12 and the chassis base 16. That is, with the space between the PDP 12 and the chassis base 16, the first region A indicates the space corresponding to the 1/5 location of the electrodes arranged perpendicular to the longitudinal side of the PDP 12 and drawn from the lower long-sided periphery of the PDP 12.

Specifically, the first heat sink 50 has a high thermal conduction medium 51 attached to the chassis base 16 at the first region A between the PDP 12 and the chassis base 16, and a low thermal conduction medium 52 attached to the PDP 12. The high thermal conduction medium 51 may be formed with a heat dissipation sheet based on a material having a thermal conductivity of 0.5 W/mK or more, such as a metallic material like aluminum or steel, silicone, acryl, graphite, rubber, and carbon nanotube (CNT). The low thermal conduction medium 52 may be formed with a heat dissipation sheet based on a material having a thermal conductivity of 0.5 W/mK or less, such as plastic resin, silicone, acryl, and rubber. An adhesive layer (not shown) is disposed between the high thermal conduction medium 51 and the chassis base 16 to attach the high thermal conduction medium 51 to the chassis base 16. Furthermore, a separate adhesive layer (not shown) is disposed between the low thermal conduction medium 52 and the PDP 12 to attach the low thermal conduction medium 52 to the PDP 12. Moreover, a separate adhesive layer (not shown) is disposed between the high thermal conduction medium 51 and the low thermal conduction medium 52 to attach them to each other. Particularly, the low thermal conduction medium 52 is formed with a material having a predetermined elasticity to enhance the adhesion of the PDP and the high thermal conduction medium 51 by way of the adhesive layer. Alternatively, the low thermal conduction medium 52 may be provided with a layer of air having a relatively low thermal conductivity, compared to that of the high thermal conduction medium 51.

The second heat sink 60 is disposed between the PDP 12 and the chassis base 16, and positioned at a second region B where the heat generated from the PDP 12 is substantially concentrated. The second heat sink 60 has a structure capable of easily dissipating and diffusing the heat generated from the PDP 12 to the chassis base 16. The second region B refers to the heat dissipation region of the PDP 12 between the PDP 12 and the chassis base 16 except for the first region A.

In this embodiment, the second heat sink 60 has a high thermal conduction medium 61 positioned at the second region B between the PDP 12 and the chassis base 16 and attached to the PDP 12, and a low thermal conduction medium 62 attached to the chassis base 16. The high thermal conduction medium 61 and the low thermal conduction medium 62 may be formed with the same material as that of the high and the low thermal conduction media 51 and 52 of the first heat sink 50. The second heat sink 60 has a common heat dissipation structure disposed between the PDP and the chassis base. With the common plasma display apparatus, a heat dissipation sheet corresponding to the high thermal conduction medium 61 is attached to the chassis base 16 between the PDP 12 and the chassis base 16, and a layer of air corresponding to the low thermal conduction medium 62 is present between the PDP 12 and the heat dissipation sheet.

With the above-structured plasma display apparatus 100, when the cover plate 32 is fitted to the chassis base 16, it compresses the driver IC 23 with a predetermined pressure. The driver IC 23 is then adhered to the chassis base 16 tightly.

When the PDP 12 is driven, the heat generated from the driver ICs 23 is partially conducted to the cover plates 32 via the sheet-typed thermal conduction media 36, and partially conducted to the chassis base 16 via the liquid or gel-typed thermal conduction media 31.

In this process, when the heat generated from the driver ICs 23 is conducted to the chassis base 16 via the thermal conduction media 31, the high thermal conduction medium 51 of the first heat sink 50 positioned at the first region A between the PDP 12 and the chassis base 16 diffuses the heat to the directions of the thickness and plane of the chassis base 16 corresponding to the first region A, thereby enhancing the heat dissipation characteristic of the driver ICs 23.

Meanwhile, as like with the common plasma display apparatus, the second heat sink 60 may diffuse and dissipate the heat generated from the PDP 12 to the chassis base 16.

Figure 7:
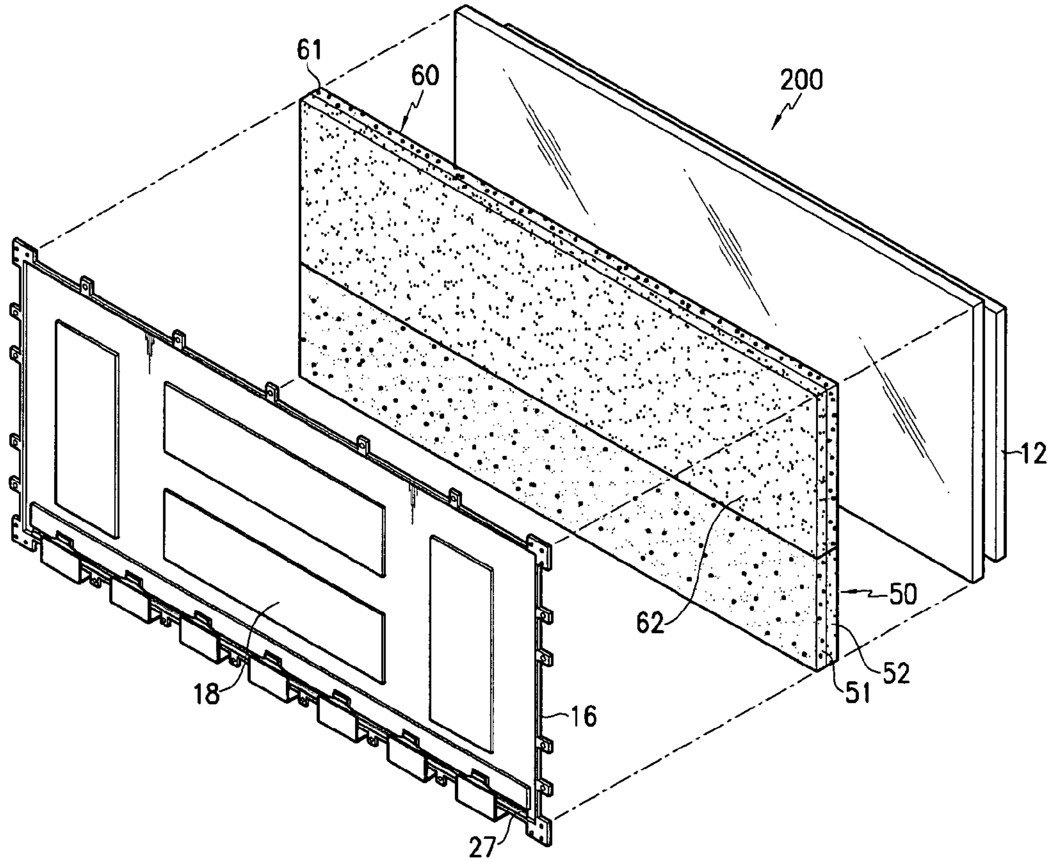
FIG. 7 is an exploded perspective view of a plasma display apparatus according to a fourth embodiment of the present invention.
Figure 8:
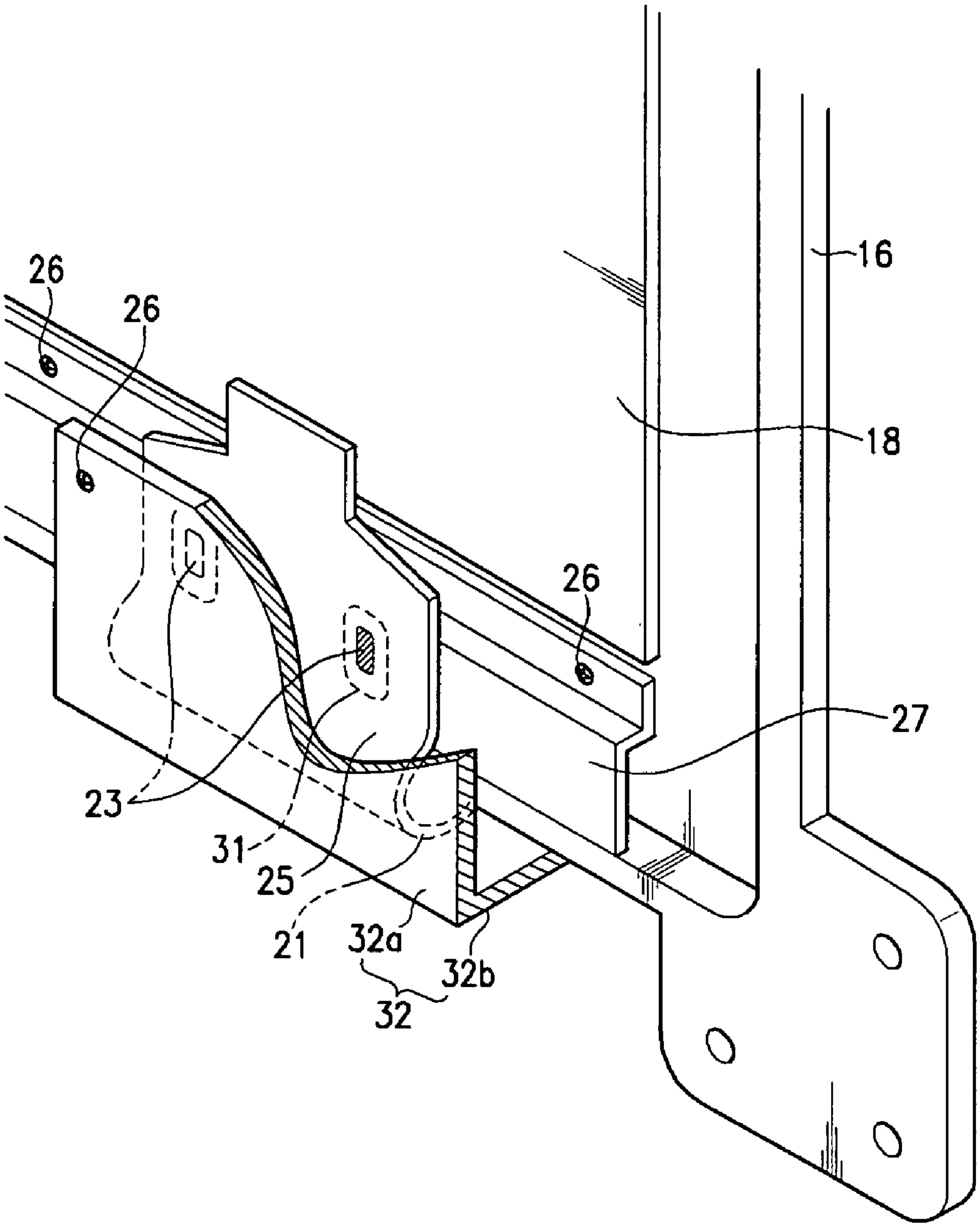
FIG. 8 is a partial sectional perspective view of the chassis base shown in FIG. 7.
Figure 9:
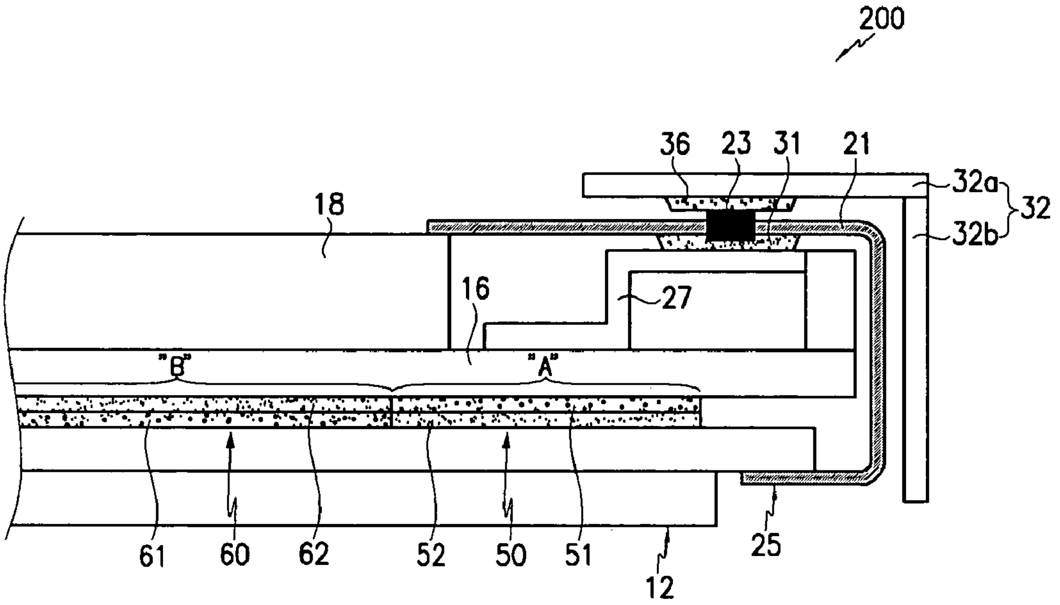
FIG. 9 is a combinatorial sectional view of the plasma display apparatus shown in FIG. 7.

FIG. 7 is an exploded perspective view of a plasma display apparatus according to a fourth embodiment of the present invention, and FIG. 8 is a partial sectional perspective view of the chassis base shown in FIG. 7. FIG. 9 is a combinatorial sectional view of the plasma display apparatus shown in FIG. 7.

As shown in FIGS. 7 to 9, the plasma display apparatus 200 according to the fourth embodiment of the present invention has the same basic structure as that related to the third embodiment except that a high thermally conductive solid member 27 is disposed between the driver ICs 23 and the chassis base 16 while being adhered thereto.

The high thermally conductive solid member 27 longitudinally proceeds along the periphery of the chassis base 16 between the chassis base 16 and the driver ICs 23. The high thermally conductive solid member 27 may be coupled to the chassis base 16 using a common coupling member 26, such as a screw, and formed with aluminum, copper or iron, as like with the chassis base 16. The high thermally conductive solid member 27 conducts the heat generated from the driver ICs 23 to the chassis base 16.

With the above-structured plasma display apparatus 200, the cover plate 32 is placed parallel to the high thermally conductive solid member 27, and coupled to the high thermally conductive solid member 27 using a coupling member 26, such as a screw. When the cover plate 32 is fitted to the high thermally conductive solid member 27, it compresses the driver IC 23 against the high thermally conductive solid member 27.

A silicone sheet-typed thermal conduction medium 36 may be disposed between the cover plate 32 and the driver IC 23 to conduct the heat generated from the driver IC 23 to the cover plate 32. Consequently, the heat generated from the driver ICs 23 is conducted to the cover plates 32 via the thermal conduction media 36, and dissipated to the outside.

In this embodiment, a liquid or gel-typed thermal conduction medium 31 is disposed between the driver IC 23 and the high thermally conductive solid member 27 to conduct the heat generated from the driver IC 23 to the chassis base 16 via the high thermally conductive solid member 27. Consequently, the heat generated from the driver ICs 23 is conducted to the high thermally conductive solid member 27 via the thermal conduction media 31, and to the chassis base 16 via the high thermally conductive solid member 27, thereby dissipating it to the outside.

Other structural components of the plasma display apparatus 200 according to the present embodiment are like those related to the first embodiment, and hence, detailed explanation thereof will be omitted.

With the above-structured plasma display apparatus 200 according to the fourth embodiment of the present invention, when the cover plate 32 is fitted to the high thermally conductive solid member 27, it compresses the driver IC 23 with a predetermined pressure so that the driver IC 23 can be tightly adhered to the high thermally conductive solid member 27.

With the driving of the PDP 12, the heat generated from the driver ICs 23 is partially conducted to the cover plates 32 via the sheet-typed thermal conduction media 36, and partially to the high thermally conductive solid member 27 via the liquid or gel-typed thermal conduction media 31. The high thermally conductive solid member 27 in turn conducts the heat to the chassis base 16.

In this process, when the heat generated from the driver ICs 23 is conducted to the chassis base 16 via the thermal conduction media 31 and the high thermally conductive solid member 27, the high thermal conduction medium 51 of the first heat sink 50 positioned at the first region A between the PDP 12 and the chassis base 16 diffuses the heat to the directions of the thickness and plane of the chassis base 16 corresponding to the first region A, thereby enhancing the heat dissipation characteristic of the driver ICs 23.

Figure 10:
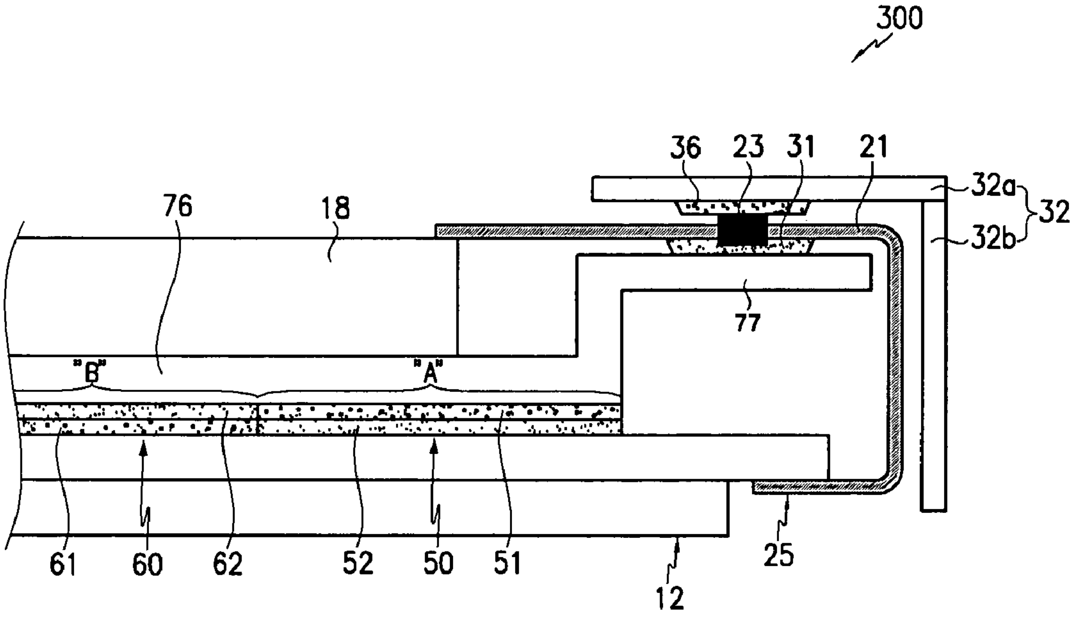
FIG. 10 is a sectional view of a plasma display apparatus according to a fifth embodiment of the present invention.

FIG. 10 is a sectional view of a plasma display apparatus according to a fifth embodiment of the present invention.

As shown in FIG. 10, the plasma display apparatus 300 according to the fifth embodiment of the present invention has a structure differentiated from that related to the fourth embodiment in that a high thermally conductive solid member 77 and a chassis base 76 are integrated in a body.

Other structural components and operations of the plasma display apparatus 300 according to the present embodiment are the same as those related to the third and the fourth embodiments, and hence, detailed explanation thereof will be omitted.

As described above, with the inventive plasma display apparatus, since the thermal conduction medium is a liquid or gel at least at the operating temperature of the PDP, an air layer is not formed on the boundary surface between the thermal conduction medium and the cover plate or between the thermal conduction medium and the driver IC, thereby enhancing the heat dissipating efficiency of the driver IC.

With the inventive plasma display apparatus, a first heat sink with a heat dissipation characteristic of the conventional PDP and a second heat sink with a heat dissipation characteristic of the conventional driver ICs are provided between the PDP and the chassis base so that the heat generated from the driver ICs can be effectively dissipated and diffused through the chassis base while maintaining the heat dissipation characteristic of the conventional PDP. Accordingly, the plasma display apparatus involves increased heat dissipation efficiency of the driver ICs, and enhanced temperature reduction effect thereof.

Although preferred embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

What is claimed is:

1. A plasma display apparatus comprising:

a plasma display panel;

a chassis base having the plasma display panel on one side surface thereof and having a driving circuit arranged on another side surface thereof;

a driver IC arranged on said another side surface of the chassis base and electrically connecting electrodes of the plasma display panel to the driving circuit, the driver IC adapted to supply voltage signals to the electrodes of the plasma display panel in accordance with signals from the driving circuit;

a cover plate comprising a first portion and a second portion extending from an end of the first portion at an angle toward a peripheral edge of the plasma display panel, the first portion arranged adjacent to the driver IC and facing the chassis base to interpose the driver IC between the chassis base and the first portion of the cover plate; and a first thermal conduction medium arranged between the first portion of the cover plate and the driver IC and adapted to transfer heat generated by the driver IC to the cover plate.

2. The plasma display apparatus of claim 1, wherein the first thermal conduction medium comprises silicone oil or a thermal grease.

3. The plasma display apparatus of claim 1, wherein a high thermally conductive solid member is between the chassis base and the driver IC.

4. The plasma display apparatus of claim 1, further comprising a third thermal conduction medium arranged between the first thermal conduction medium and the driver IC.

5. A plasma display apparatus comprising:

a plasma display panel;

a chassis base having the plasma display panel on one side surface thereof and having a driving circuit arranged on another side surface thereof;

a driver IC electrically connecting electrodes of the plasma display panel to the driving circuit, the driver IC adapted to supply voltage signals to the electrodes of the plasma display panel in accordance with signals from the driving circuit;

a cover plate comprising a first portion and a second portion extending from an end of the first portion at an angle toward a peripheral edge of the plasma display panel, the first portion arranged adjacent to the driver IC and facing the chassis base to interpose the driver IC between the chassis base and the first portion of the cover plate;

a first thermal conduction medium arranged between the first portion of the cover plate and the driver IC and adapted to transfer heat generated by the driver IC to the cover plate; and a second thermal conduction medium between the solid member and the driver IC and adapted to transfer heat generated by the driver IC to the high thermally conductive solid member, wherein a high thermally conductive solid member is on a portion of the chassis base opposite the driver IC.

6. A plasma display apparatus comprising:

a plasma display panel;

a chassis base substantially parallel to the plasma display panel with a surface facing the plasma display panel, and an opposite surface mounting a driving circuit unit thereon;

driver ICs selectively applying voltage to electrodes of the plasma display panel in accordance with the control signals from the driving circuit unit;

a cover plate placed external to the driver IC and fitted to the chassis base to compress the driver IC against the chassis base;

a first heat sink having a first structure between the plasma display panel and the chassis base, the first heat sink at a first region where the heat generated from the driver ICs is substantially concentrated; and a second heat sink having a second structure between the plasma display panel and the chassis base, the second heat sink at a second region different from the first region, wherein the second structure is different from the first structure in a thickness direction of the structures between the plasma display panel and the chassis base.

7. The plasma display apparatus of claim 6, wherein the driver ICs are at the periphery of the chassis base corresponding to the one-sided periphery of the plasma display panel.

8. The plasma display apparatus of claim 6, wherein the first region is the heat dissipation region of the driver ICs, and the second region is the heat dissipation region of the plasma display panel.

9. The plasma display apparatus of claim 6, wherein the first heat sink has a high thermal conduction medium attached to the chassis base at the first region between the plasma display panel and the chassis base, and a low thermal conduction medium attached to the plasma display panel at the first region between the plasma display panel and the chassis base.

10. The plasma display apparatus of claim 6, wherein the second heat sink has a high thermal conduction medium attached to the plasma display panel at the second region between the plasma display panel and the chassis base, and a low thermal conduction medium attached to the chassis base at the second region between the plasma display panel and the chassis base.

11. The plasma display apparatus of claim 6, wherein the driver ICs are packaged in a tape carrier package (TCP), and electrically connected to the driving circuit unit and the electrodes of the plasma display panel.

12. The plasma display apparatus of claim 6, further comprising a thermal conduction medium between the cover plate and the driver IC to conduct the heat generated from the driver IC to the cover plate.

13. The plasma display apparatus of claim 6, wherein a high thermally conductive solid member is disposed between the driver ICs and the chassis base.

14. The plasma display apparatus of claim 13, wherein the high thermally conductive solid member is integrated with the chassis base in a body.

15. The plasma display apparatus of claim 14, wherein the thermal conduction medium comprises liquid or gel typed silicone oil or thermal grease.

16. A plasma display apparatus comprising:

a plasma display panel;

a chassis base substantially parallel to the plasma display panel with a surface facing the plasma display panel, and an opposite surface mounting a driving circuit unit thereon;

driver ICs for selectively applying voltage to electrodes of the plasma display panel in accordance with control signals from the driving circuit unit;

a cover plate placed external to the driver IC and fitted to the chassis base to compress the driver IC against the chassis base;

a first heat sink between the plasma display panel and the chassis base, the first heat sink being positioned at a first region where the heat generated from the driver ICs is substantially concentrated; and a second heat sink at a second region between the plasma display panel and the chassis base except for the first region, wherein the first heat sink has a high thermal conduction medium attached to the chassis base at the first region between the plasma display panel and the chassis base, and a low thermal conduction medium attached to the plasma display panel at the first region between the plasma display panel and the chassis base, and wherein the high thermal conduction medium comprises a sheet based on a material having a thermal conductivity of 0.5 W/mK or more, selected from the group consisting of metal, silicone, acryl, graphite, rubber, and carbon nanotube, and the low thermal conduction medium comprises a sheet based on a material different from the material for the high thermal conduction medium and having a thermal conductivity of 0.5 W/mK or less, selected from the group consisting of plastic resin, silicone, acryl, and rubber.

17. A plasma display apparatus comprising:

a plasma display panel;

a chassis base substantially parallel to the plasma display panel with a surface facing the plasma display panel, and an opposite surface mounting a driving circuit unit thereon;

driver ICs for selectively applying voltage to electrodes of the plasma display panel in accordance with control signals from the driving circuit unit;

a cover plate placed external to the driver IC and fitted to the chassis base to compress the driver IC against the chassis base;

a first heat sink between the plasma display panel and the chassis base, the first heat sink being positioned at a first region where the heat generated from the driver ICs is substantially concentrated; and a second heat sink at a second region between the plasma display panel and the chassis base except for the first region, wherein the second heat sink has a high thermal conduction medium attached to the plasma display panel at the second region between the plasma display panel and the chassis base, and a low thermal conduction medium attached to the chassis base at the second region between the plasma display panel and the chassis base, and wherein the high thermal conduction medium is formed with a sheet based on a material having a thermal conductivity of 0.5 W/mK or more, selected from the group consisting of metal, silicone, acryl, graphite, rubber, and carbon nanotube, and the low thermal conduction medium is formed with a sheet based on a material different from the material for the high thermal conduction medium and having a thermal conductivity of 0.5 W/mK or less, selected from the group consisting of plastic resin, silicone, acryl, and rubber.

18. An apparatus for dissipating heat generated in a plasma display device, the plasma display device including a driver IC for driving a plasma display panel, the driver IC being covered on two sides by a cover plate and being mounted on a chassis base, the apparatus comprising:

a first thermal conduction medium located between the driver IC and the cover plate;

a highly thermally conductive solid member attached to the chassis base;

a second thermal conduction medium located between the driver IC and the highly thermally conductive solid member; and a fastener compressing together the cover plate, the first thermal conduction medium, the driver IC, the second thermal conduction medium, the highly thermally conductive solid member, and the chassis base.

19. The apparatus of claim 18, further comprising a thermal conduction sheet located between the first thermal conduction medium and the driver IC.

20. An apparatus for dissipating heat generated in a plasma display device, the plasma display device including a driver IC for driving a plasma display panel and the driver IC being covered on two sides by a cover plate and being mounted on a chassis base, the apparatus comprising:

a first thermal conduction medium between the driver IC and the cover plate;

a second thermal conduction medium between the driver IC and the chassis base;

a first heat sink having a first structure between the chassis base and the plasma display panel on a region of the chassis base where heat generated by the driver IC is concentrated; and a second heat sink having a second structure between the chassis base and the plasma display panel on a region of the chassis base where heat generated by the plasma display panel is concentrated, wherein the second structure is different from the first structure in a thickness direction of the structures between the chassis basis and the plasma display panel.

21. The apparatus of claim 20, wherein the first heat sink comprises:

a first high thermal conduction medium attached to the chassis base; and a first low thermal conduction medium attached to the plasma display panel, and wherein the second heat sink comprises:

a second low thermal conduction medium attached to the chassis base; and a second high thermal conduction medium attached to the plasma display panel.

* * * * *